United States Patent [19]

Koo et al.

[11] Patent Number: 4,600,885
[45] Date of Patent: Jul. 15, 1986

[54] FIBER OPTIC MAGNETOMETER FOR DETECTING DC MAGNETIC FIELDS

[75] Inventors: Kee P. Koo; Anthony Dandridge, both of Alexandria, Va.; Alan B. Tveten, Fort Washington, Md.; George H. Sigel, Jr., Great Falls, Va.

[73] Assignee: The United States of America as represented by the Secretary of the Navy, Washington, D.C.

[21] Appl. No.: 610,463

[22] Filed: May 15, 1984

[51] Int. Cl.[4] .................................. G01R 33/02
[52] U.S. Cl. ..................... 324/244; 324/260
[58] Field of Search ............. 324/244, 260, 96; 350/376, 96.29

[56] References Cited

U.S. PATENT DOCUMENTS

| | | | |
|---|---|---|---|
| 4,147,979 | 4/1979 | Baues et al. | 324/244 |
| 4,376,248 | 3/1983 | Giallorenzi et al. | |
| 4,378,497 | 3/1983 | Giallorenzi | |
| 4,433,291 | 2/1984 | Yariv et al. | |

FOREIGN PATENT DOCUMENTS 2014291 7/1971 Fed. Rep. of Germany ........ 324/96

OTHER PUBLICATIONS

Rashleigh, S.C., Magnetic-Field Sensing with a Single Mode Fiber, 01-81, vol. 6, No. 1/Optics Letters, pp. 19–21.
Electron Lett. 16, 408–409 (1980), Dandridge, et al.
Optics Letters, vol. 7, No. 7, Jul. 1982, (Koo, et al.).

Primary Examiner—Reinhard J. Eisenzopf
Assistant Examiner—Robert W. Mueller
Attorney, Agent, or Firm—Robert F. Beers; Sol Sheinbeing; William R. Sharp

[57] ABSTRACT

A fiber optic magnetometer for detecting DC magnetic fields includes a first optical fiber having a magnetostrictive jacket thereon which defines a sensing arm, and a second fiber defining a reference arm. An AC magnetic field of frequency $\omega_o$ and constant amplitude is imposed on the magnetostrictive jacket so as to cause a time varying optical path length change, having an $\omega_o$ component, in the sensing arm fiber. This induces a corresponding time varying phase shift, also having an $\omega_o$ component, in light transmitted through the sensing arm fiber which is detected by a phase detector. The phase detector produces a signal proportional to the phase shift, this signal being passed to a lock-in amplifier set to amplify at $\omega_o$. The lock-in amplifier produces an output signal proportional to the amplitude of the $\omega_o$ component, wherein this amplitude is proportional to any DC magnetic fields to which the device is exposed.

8 Claims, 1 Drawing Figure

FIBER OPTIC MAGNETOMETER FOR DETECTING DC MAGNETIC FIELDS

BACKGROUND OF THE INVENTION

This invention relates to magnetometers, and more particularly to fiber optic magnetometers.

The possibility of detecting weak magnetic fields by using magnetostrictive perturbations has been discussed in "Detection of Magnetic Fields Through Magnetostrictive Perturbations of Optical Fibers", Optics Letters, Vol. 5, No. 3, March 1980. The basic principle of operation of such a sensor involves the measurement of longitudinal strain induced in an optical fiber by a dimension-changing magnetostrictive element. When the magnetostrictive material is in the presence of a magnetic field it is caused to undergo dimensional changes which stretch the optical fiber so as to lengthen its optical path. This causes a detectable phase shift in light passing therethrough when compared to light passing through an optical fiber of a reference arm which is not affected by the magnetic field. Reference may be made to an article entitled "Optical Fibre Magnetic Field Sensors" by Dandridge et al, *Electron. Lett.*, Vol. 16, pp. 408–409 (1980), and "Characteristics of Fiber-Optic Magnetic-Field Sensors Employing Metallic Glasses" by Koo et al., *Optics Letters*, Vol. 7, No. 7, pp. 334–336 (July 1980) for disclosure of prior art magnetometers.

The sensitivity of fiber optic magnetometers is determined by the long lengths of active sensing element (termed the sensing arm) and the ability to measure small signal induced phase shifts. In the fiber optic sensors built to date, the signal band of interest has typically been above 10 Hz. In this range the minimum detectable phase shift is about $10^{-6}$ rad. At frequencies below 10 Hz, the performance of the magnetometer is degraded by the following factors;

(i) intrusion into the signal band of the intensity noise (IN) of the laser. (ii) intrusion into the signal band of the phase noise (PN) of the laser, (iii) spurious signals due to differential thermal drift (TD between the arms). The frequency spectrum of i and ii has a 1/f frequency dependence (yielding a typical $10^4$ degradation in sensitivity at 0.1 Hz), and (iii) manifests itself at very low frequencies close to and at DC, making DC measurements almost impossible. Effects ii and iii may also cause signal fading in the device, as well as a nonlinear response and frequency up conversion.

SUMMARY OF THE INVENTION

It is an obJect of the present invention to provide a fiber optic magnetometer insensitive to the three perturbations described above, therefore allowing small DC magnetic fields to be measured.

The above obJect is realized in a fiber optic magnetometer which utilizes an AC magnetic field imposed on a fiber optic sensing arm. The magnetometer of the present invention includes a length of optical fiber having an optical length L in an unstrained condition, and a magnetostrictive element closely associated with the fiber which undergoes a dimensional change in the presence of a magnetic field. This dimensional change results in a strain imposed on the fiber which causes a change in the fiber's optical length, $\Delta L$. An AC magnetic field source is provided for generating an AC field having a frequency $\omega_o$ in the vicinity of the magnetostrictive element so as to cause a time varying $\Delta L$, which has several frequency components, one of these being an $\omega_o$ component. The AC field source is nonvariable with respect to the amplitude of AC field generated thereby. Finally, a detection means is provided for detecting the $\omega_o$ component, the amplitude of which is proportional to a DC magnetic field to which the magnetostrictive element is exposed.

In the preferred embodiment, an interferometric phase detector is utilized to detect a phase shift in a light beam transmitted through the sensing arm fiber, wherein the phase shift is caused by and is proportional to the change in length $\Delta L$. In addition, the phase detector generates a signal proportional to the phase shift which is coupled into a lock-in amplifier. The lock-in amplifier is set to amplify only the $\omega_o$ component, thus providing a convenient means of detecting this particular component whose amplitude is proportional to a DC field.

DESCRIPTION OF THE PREFERRED EMBODIMENT

Figure 1:
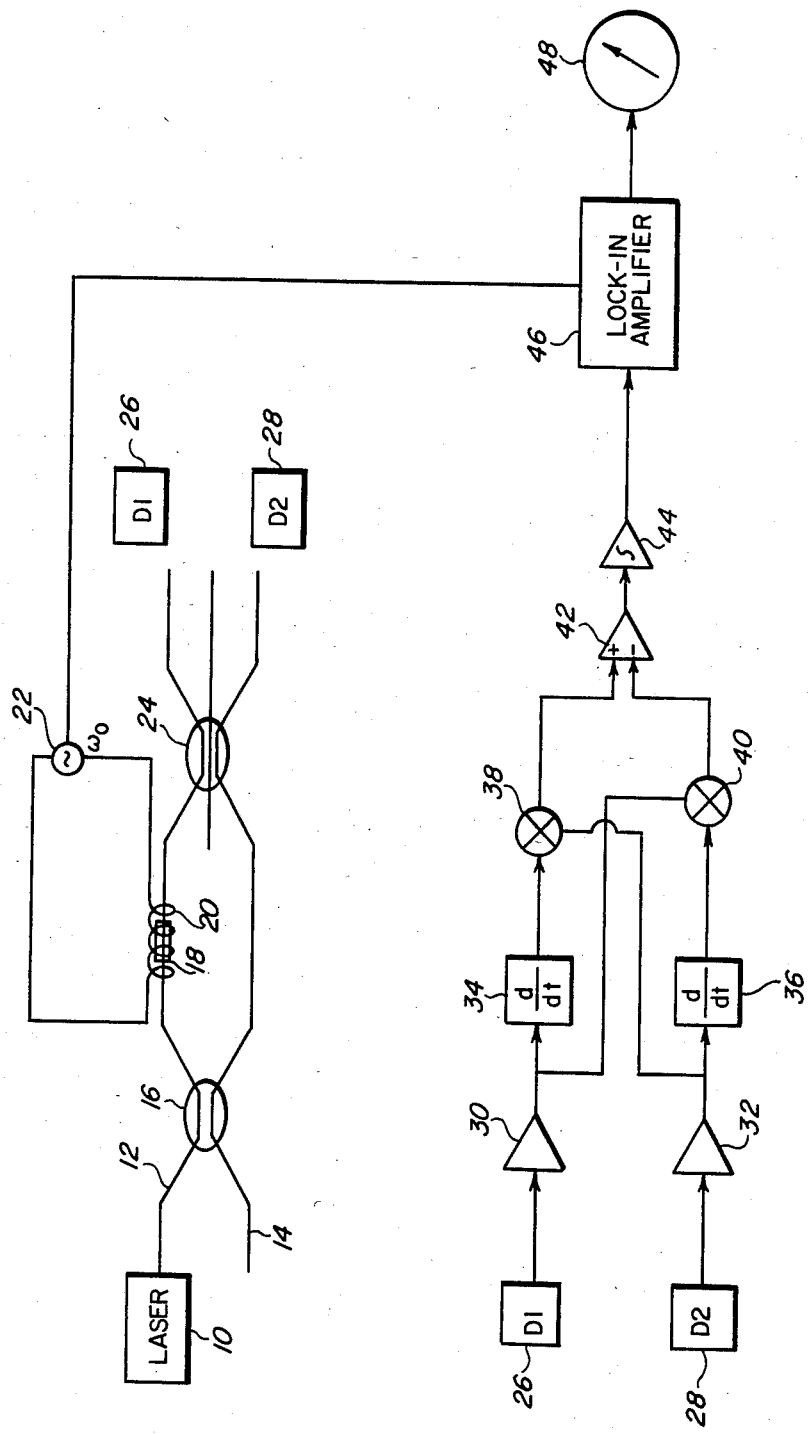
FIG. 1 is a schematic illustration of one embodiment of the present invention.

A fiber optic magnetometer for the detection of DC magnetic fields is described herein which utilizes an AC magnetic field imposed on a sensing arm.

Referring now to FIG. 1, a schematic illustration of one embodiment of the present invention is shown. Laser 10 is provided to transmit a beam through optical fiber 12. As shown, a second fiber 14 is also provided. Both fibers 12 and 14 are coupled into a 2×2 bottle coupler 16 which functions to divide the input beam from fiber 12 into two beams by evanescent field coupling. Reference may be made to U.S. Pat. No. 4,264,126, whose disclosure is herein incorporated by reference, for a description of this type of field coupling. Thus, coherent light of the same magnitude and wavelength is caused to propagate through each fiber.

Fiber 12 is received inside a magnetostrictive jacket 18 which may be made of a magnetostrictive material such as nickel. Typically, the jacket is bonded to fiber 12 with an epoxy resin. Upon exposure to a magnetic field, the longitudinal dimension of jacket 18 is altered, transmitting a strain to fiber 12. Consequently, the optical path length of light passing through fiber 12 is changed so as to induce a phase shift in the light. Fiber 14 does not have its optical length changed, such that light passing through it does not experience a phase shift.

As shown, a coil 20 is situated in proximity to jacket 18 so as to be coaxially positioned with respect to jacket 18. Coil 20 is supplied with an AC current having a frequency $\omega_o$ by an oscillator 22. The frequency $\omega_o$ may be from about 10 Hz to about 1 KHz. As explained above, it is not desirable to operate the device below 10 Hz, since in this frequency range various perturbations occur which destroy device accuracy. To obtain the best results, a frequency $\omega_o$ above 500 KHz should be used. Furthermore, oscillator 22 is nonvariable with respect to the amplitude of the AC signal generated thereby. Thus, an AC magnetic field having a constant amplitude $H_{AC}$ is generated by coil 20 in the vicinity of jacket 18 so as to cause time varying dimensional changes in the jacket, as will be explained in detail below.

As discussed above, Dandridge et al and Koo et al. disclose prior art fiber optic magnetometers. In each reference, a coil and associated AC current are provided to impose an AC magnetic field on a sensing arm. It is emphasized that the AC current source is necessarily variable as to amplitude, since the AC field generated by the coil is varied over a wide range of amplitudes in order to evaluate the sensitivity of the sensor. In the present invention, the amplitude of the AC magnetic field is held constant, and is not provided as a testing mechanism. As noted above, the oscillator 22 is nonvariable with respect to amplitude.

Fibers 12 and 14 are each coupled into a 3×3 bottle coupler 24 which will give two outputs A $\sin\theta$ and B $\sin\theta$ (i.e. $\pi/2$ phase difference). Here, A and B are constants depending on the power splitting ratio of the coupler 24 and $\theta$ is the phase shift induced in light transmitted through fiber 12. These outputs are fed into photodetectors 26 and 28, labeled D1 and D2 respectively, which detect light incident thereon in a conventional manner.

Here, fiber 12 defines a sensing arm between the couplers, and fiber 14 defines a reference arm between the couplers. Typically, the path length difference between the sensing arm and the reference arm is shorter than the coherence length of laser 10. For ultimate performance, the arms are equal in length.

As shown, the outputs from detectors 26 and 28 are coupled into amplifiers 30 and 32, respectively. Amplifiers 30 and 32 amplify the received signals, and produce amplified output signals which are fed into differentiators 34 and 36, each of which are labeled d/dt in the Figure. In addition, multiplier 38 receives an output signal from amplifier 32, and multiplier 40 receives an output from amplifier 30. Multipliers 38 and 40 multiply their respective inputs in a manner well known in the art, and generate outputs which are received by differential amplifier 42. Differential amplifier 42 generates a signal proportional to the difference of its inputs, this signal being coupled into integrator 44, whose output is received by lock-in amplifier 46. The output of integrator 44 is proportional to the above-mentioned phase shift $\theta$. As shown, lock in amplifier 46 receives a reference signal at frequency $\omega_o$ from oscillator 22, such that the lock-in amplifier acts as a filter to filter out all components of an input signal other than $\omega_o$ components. Such a lock-in amplifier as described above is commercially available from EG&G Corporation of Princeton, N.J. One suitable lock-in amplifier model is model no. 5204. Finally, lock-in amplifier 46 produces an output which is fed into a meter 48, such as a voltmeter. The reading obtained on meter 48 is proportional to any DC magnetic fields to which the magnetostrictive jacket 18 is exposed, as will be explained below.

In operation, the magnetometer illustrated in FIG. 1 operates to detect DC fields as follows. A laser beam from laser 10 is split by bottle coupler 16 into two coherent beams, as discussed above, which are transmitted through fibers 12 and 14. The AC magnetic field, which is constant in amplitude ($H_{AC}$), generated by coil 20 causes a dimensional change in jacket 18, thereby imposing a longitudinal strain on fiber 12. Thus, the AC magnetic field acts to produce a time varying change in optical length of fiber 12, so as to also cause a time varying phase shift $\theta$ to be induced in the light transmitted through fiber 12.

$\Delta L$, which is the differential path length change from a length L of fiber 12 in an unstrained condition, is given by $$\Delta L = C_n H^{2n}, \qquad (1)$$

where $C_n$ is a constant, and H is the magnetic field strength. For the purpose of illustration, let n=1, $H = H_{DC} + H_{AC}\cos\omega_o t$ where $H_{DC}$ is a magnetic field to which the jacket 18 is exposed, then, $$\Delta L = C_1(H_{DC} + H_{AC}\cos\omega_o t)^2 \qquad (2)$$

$$= C_1 H_{DC}^2 + 2 C_1 H_{DC} H_{AC}\cos\omega_o t + C_1 H_{AC}^2 \cos^2 \omega_o t$$

$$\Delta L = C_1[H_{DC}^2 + \tfrac{1}{2} H_{AC}^2] +$$

$$2C_1 H_{DC} H_{AC}\cos\omega_o t + \tfrac{1}{2} C_1 H_{AC}^2 \cos 2\omega_o t.$$

Light from both fibers 12 and 14 is coupled into 3×3 bottle coupler 24. The light beams from each fiber combine with each other in coupler 24 to give outputs A $\sin\theta$ and B $\cos\theta$. For purposes of illustration, it will be assumed that the output conducted by fiber 12 to detector 26 is A $\sin\theta$, and that the output from fiber 14 to detector 28 is B $\cos\theta$. As can be seen from FIG. 1, one output from 3×3 coupler 24 is not being used in the present device.

The above mentioned outputs are detected, and signals from detectors 26 and 28 are amplified by amplifiers 30 and 32. For the sake of simplicity, the constants A and B will be assumed to remain the same. Thus, signals A $\sin\theta$ and B $\cos\theta$ are fed into differentiators 34 and 36, respectively. Differentiator 34 produces an output signal A $\cos\theta$ (d$\theta$/dt), and differentiator 36 generates an output signal $-$B$\sin\theta$ (d$\theta$/dt). These differentiator output signals are simply the derivatives of A $\sin\theta$ and B $\cos\theta$. The amplifier outputs are also fed into multipliers 38 and 40, such that each multiplier multiplies its two inputs. Therefore, multiplier 38 performs the function (B $\cos\theta$)·(A $\cos\theta$ (d$\theta$/dt)) to yield AB$\cos^2\theta$ (d$\theta$/dt). Similarly, multiplier 40 performs the function (A $\sin\theta$)·($-$B$\sin\theta$ (d$\theta$/dt)) to yield $-$AB $\sin^2\theta$ (d$\theta$/dt). Differential amplifier 42 receives the above output signals from the multipliers so as to substract one from the other to give an output $$AB \cos^2\theta \frac{d\theta}{dt} + AB \sin^2\theta \frac{d\theta}{dt} = \qquad (3)$$

$$AB \frac{d\theta}{dt} (\cos^2\theta + \sin^2\theta) = AB \frac{d\theta}{dt}.$$

Integrator 44 integrates this, producing an output E as follows:

$$E = AB \int \frac{d\theta}{dt} dt \qquad (4)$$

$$= AB\theta$$
$$= M\theta$$

Thus, the output signal E is proportional to the phase shift $\theta$.

The phase shift can be expressed as $$\theta = 2\pi \Delta L/\lambda. \qquad (5)$$

Therefore, the phase shift is proportional $\Delta L$ since $\lambda$ is a constant.

Combining the equations (4) and (5), it can be seen that output E is proportional ΔL. Thus, from (2), E can be expressed as $$E = K[H_{DC}^2 + \tfrac{1}{2} H_{AC}^2] + \quad (6)$$

$$2K\,H_{DC}H_{AC}\cos\omega_o t + \tfrac{1}{2} K\,H_{AC}^2 \cos 2\omega_o t,$$

where K is a constant. Thus, E, as well as θ and ΔL, have three frequency components, one of which is the $\omega_o$ component $2KH_{DC}H_{AC}\cos\omega_o t$.

Lock-in amplifier 46, which is set to produce an amplified output only at the frequency $\omega_o$, receives output E and passes only the $\omega_o$ component. This $\omega_o$ component is $2KH_{DC}H_{AC}\cos\omega_o t$, as can be seen from (6). Lock-in amplifier 46 produces an output which is proportional to the amplitude of the $\omega_o$ component. This output is essentially DC, and is measured and displayed by meter 48. The above mentioned amplitude, 2K $H_{DC}$ $H_{AC}$, is proportional to $H_{DC}$ since $H_{AC}$ is a constant. Thus, the reading obtained on meter 48 is proportional to $H_{DC}$, and indicates the magnitude of any DC magnetic fields to which the device is exposed.

In the above described illustrated embodiment, 3×3 coupler 24, detectors 26 and 28, and the various electronic components through integrator 44 constitute a passive phase detector wherein the phase of light transmitted through each arm are compared, and wherein an output signal is produced which is proportional to the phase shift. Such a passive phase detector system is described in detail in an article by K. P. Koo et al. entitled "Passive Stabilization Scheme for Fiber Interferometers using (3×3) Fiber Directional Couplers", Appl. Phys. Lett. 41(7), Oct. 1, 1982, pp. 616–618, whose disclosure is herein incorporated by reference. It should be understood that any detection scheme which accurately detects the phase shift in a sensing arm and produces an output proportional to the phase shift would be suitable according to the present invention. For example, a feedback system utilizing a phase compensator on the reference arm could be employed as one alternative. See U.S. Pat. No. 4,378,497 of Giallorenzi for a disclosure of such a feedback system.

For a discussion of an experimental arrangement constructed according to the FIG. 1 embodiment, reference may be made to an article entitled "A Fiber-Optic DC Magnetometer" by Koo et al., Journal of Lightwave Technology, Vol LT-1, No. 3, Sept. 1983, pp. 524–525, whose disclosure is herein incorporated by reference.

Thus, there is provided by the present invention a DC fiber optic magnetometer which is insensitive to intensity noise, phase noise, and thermal drift related spurious signals due to the use of an AC magnetic field imposed on a sensing arm of the magnetometer. The magnetometer is designed to produce an output which is proportional to any DC fields to which the device is exposed. Prior art fiber optic magnetometers are incapable of accurately measuring DC fields due to their sensitivity to the above mentioned perturbations.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A fiber optic magnetometer for detecting DC magnetic fields comprising:

a length of optical fiber having an optical length L in an unstrained condition;

magnetostrictive means closely associated with said fiber such that said magnetostrictive means undergoes a dimensional change in the presence of a magnetic field so as to strain said fiber and change the optical length of said fiber, the change in optical length being denoted as ΔL;

an AC field generating means for generating an AC magnetic field having a frequency $\omega_o$ in the vicinity of said magnetostrictive means so as to cause dimensional changes in said magnetostrictive means, said AC field generating means being nonvariable with respect to the amplitude of the AC field generated thereby, whereby said AC magnetic field generating means causes a time varying ΔL having several frequency components, one of the components being an $\omega_o$ component which has an amplitude;

detection means for detecting the $\omega_o$ component, the amplitude of the $\omega_o$ component being proportional to the magnitude of a DC magnetic field to which said magnetostrictive means is exposed.

2. A magnetometer as recited in claim 1, wherein said AC magnetic field generating means includes a wire coil in proximity to said magnetostrictive means, and an AC current source for supplying an AC current of frequency $\omega_o$ to said coil, said AC current source being nonvariable with respect to the amplitude of the AC current generated thereby.

3. A magnetometer as recited in claim 1, wherein said detection means comprises: a light source means for transmitting a beam of light through said optical fiber; a phase detector means for detecting a phase shift in the light beam in said optical fiber resulting from the change of length of said fiber, said phase detector means producing a signal proportional to the phase shift, the phase shift being proportional ΔL; and a filter means, which receives the phase detector means signal, for filtering out all the frequency components other than the $\omega_o$ component so as to pass only the $\omega_o$ component to its output.

4. A magnetometer as recited in claim 3 wherein said filter means is a lock-in amplifier set to amplify at $\omega_o$.

5. A magnetometer as recited in claim 4 wherein $\omega_o$ is between 10 Hz and 1 KHz.

6. A magnetometer as recited in claim 4, wherein said phase detector means includes a second optical fiber equal in length to the other optical fiber, said second optical fiber also receiving a light beam from said light source means, wherein said phase detector means interferometrically detects the phase shift by comparing the phase of the beams transmitted through each said optical fiber.

7. A method of detecting DC magnetic fields comprising the steps of:

providing a length of optical fiber having an optical length L in an unstrained condition;

providing a magnetostrictive means closely associated with said fiber such that said magnetostrictive means undergoes a dimensional change in the presence of a magnetic field so as to strain said fiber and change the optical length of said fiber, the change in optical length being denoted as ΔL;

generating an AC magnetic field having a frequency $\omega_o$ in the vicinity of said magnetostrictive means so as to cause dimensional changes in said magnetostrictive means, said AC field generating means being nonvariable with respect to the amplitude of the AC field generated thereby, whereby said AC magnetic field generating means causes a time varying $\Delta L$ having several frequency components, one of the components being an $\omega_o$ component which has an amplitude;

detecting the $\omega_o$ component, the amplitude of the $\omega_o$ component being proportional to the magnitude of a DC magnetic field to which said magnetostrictive means is exposed.

8. A fiber optic magnetometer for detecting DC magnetic fields comprising:

a reference arm which includes a length of optical fiber;

a sensing arm which includes a length of optical fiber equal in length to that of said reference arm, said sensing arm fiber having a magnetostrictive means closely associated therewith which undergoes a dimensional change in the presence of a magnetic field so as to change the optical length of said sensing arm;

a light source means for transmitting a light beam through each said arm, whereby in the presence of a magnetic field the change in length of said sensing arm induces a phase shift in the beam transmitted therethrough;

an AC magnetic field source which includes a wire coil in proximity to said magnetostrictive means, and an AC current source for supplying an AC current of frequency $\omega_o$ to said coil, said AC current source being nonvariable with respect to the amplitude of the AC current generated thereby, whereby the AC magnetic field produces a time-varying phase shift having several frequency components, one of the components being an $\omega_o$ component which has an amplitude;

interferometric phase detector means for detecting the phase shift by comparing the phase of the beams transmitted through each fiber, said phase detector means producing a signal proportional to the detected phase shift;

a lock-in amplifier for receiving and amplifying the signal from said phase detector means, said lock-in amplifier being set to produce an amplified output only for the $\omega_o$ component.

* * * * *